(12) United States Patent
Shirato et al.

(10) Patent No.: US 8,016,182 B2
(45) Date of Patent: Sep. 13, 2011

(54) WIRE LOOP, SEMICONDUCTOR DEVICE HAVING SAME AND WIRE BONDING METHOD

(75) Inventors: Mizuho Shirato, Tokyo (JP); Hiromi Fujisawa, Tokyo (JP); Tadahisa Akita, Tokyo (JP)

(73) Assignee: Kaijo Corporation, Tokyo (JP)

( * ) Notice: Subject to any disclaimer, the term of this patent is extended or adjusted under 35 U.S.C. 154(b) by 626 days.

(21) Appl. No.: 11/125,924

(22) Filed: May 10, 2005

(65) Prior Publication Data

US 2006/0255101 A1 Nov. 16, 2006

(51) Int. Cl.
B23K 1/06 (2006.01)
B23K 20/10 (2006.01)

(52) U.S. Cl. .................. 228/180.5; 228/4.5; 228/110.1; 228/1.1

(58) Field of Classification Search .............. 228/4.5, 228/180.5, 6.2, 179.1, 180.1, 904, 110.1, 228/1.1
See application file for complete search history.

(56) References Cited

U.S. PATENT DOCUMENTS

| | | | |
|---|---|---|---|
| 5,299,729 A | 4/1994 | Matsushita et al. | |
| 5,566,876 A | 10/1996 | Nishimaki et al. | |
| 5,735,030 A | 4/1998 | Orcutt | |
| 5,961,029 A | 10/1999 | Nishiura et al. | |
| 6,036,080 A | 3/2000 | Takahashi et al. | |
| 6,062,462 A | 5/2000 | Gillotti et al. | |
| 6,079,610 A | 6/2000 | Maeda et al. | |
| 6,080,651 A | 6/2000 | Takahashi et al. | |
| 6,268,662 B1 | 7/2001 | Test et al. | |
| 6,315,190 B1 | 11/2001 | Nishiura | |
| 6,477,768 B1 | 11/2002 | Wildner | |
| 6,774,494 B2 | 8/2004 | Arakawa | |
| 6,815,836 B2 * | 11/2004 | Ano | 257/784 |
| 2001/0002624 A1 | 6/2001 | Khandros et al. | |
| 2002/0050653 A1 | 5/2002 | Masumoto et al. | |
| 2002/0137327 A1 | 9/2002 | Arakawa | |
| 2004/0104477 A1 * | 6/2004 | Fujisawa | 257/738 |
| 2005/0072833 A1 | 4/2005 | Wong et al. | |
| 2005/0092815 A1 | 5/2005 | Mii | |
| 2005/0109819 A1 * | 5/2005 | Qin et al. | 228/180.5 |

FOREIGN PATENT DOCUMENTS

| | | |
|---|---|---|
| DE | 3621917 | 1/1988 |
| EP | 0 753 891 A2 | 1/1997 |
| EP | 1 422 014 | 11/2003 |
| JP | 1-276729 | 11/1989 |
| JP | 02-215137 | 8/1990 |
| JP | 03183139 | 9/1991 |
| JP | 3-289149 | 12/1991 |
| JP | 04-255237 | 9/1992 |
| JP | 9-51011 | 2/1997 |
| JP | 2000-36512 | 2/2000 |
| JP | 2000-277558 | 6/2000 |
| JP | 2005-019778 | 1/2005 |
| TW | 456012 | 9/2001 |

* cited by examiner

Primary Examiner — Emily M Le
Assistant Examiner — Megha Mehta

(57) ABSTRACT

A wire loop includes a wire connecting a first bonding point and a second bonding point therethrough, wherein an additional wire loop is formed after wire bonding at the second bonding point without cutting the wire and the additional wire loop is bonded to the second bonding point or to the vicinity thereof while part of the wire is crushed.

9 Claims, 7 Drawing Sheets

(f)

(g)

(h)

(i)

(j)

(k)

(a)　　(b)　　(c)　　(d)

(e)

WIRE LOOP, SEMICONDUCTOR DEVICE HAVING SAME AND WIRE BONDING METHOD

BACKGROUND OF THE INVENTION

1. Field of the Invention

The present invention relates to a wire bonding method for connecting a first bonding point and a second bonding point through a wire, a wire loop having a certain shape and a semiconductor device having such a wire loop incorporated therein.

2. Description of the Related Art

Conventionally, in a process of fabricating a semiconductor device, as shown in FIG. 5A or 5B, wire bonding for connecting a pad 2a or a first bonding point A of a semiconductor chip 2 attached to a lead frame 1 and a lead 1a or a second bonding point Z of the lead frame 1 through a wire 3 has been carried out. Typically, loop shapes of the wire 3 connecting the first and second bonding points A and Z include a trapezoidal shape and a triangular shape shown in FIGS. 5A and 5B, respectively, as disclosed, for example, in U.S. Pat. No. 6,036,080 or Japanese Patent Application Laid-Open Publication No. 2000-277558.

The wire loop having a trapezoidal shape shown in 5A is formed by a sequence of steps as shown in FIG. 6. First, in step (a) of FIG. 6, a capillary 4 through which the wire 3 passes is lowered and a ball 30 which has been formed at a tip end of the wire 3 is bonded to the pad 2a of the chip 2 or first bonding point A. Then, in step (b) of FIG. 6, the capillary 4 is vertically raised to a point B while the wire 3 is delivered. Thereafter, in step (c) of FIG. 6, the capillary 4 is horizontally moved to a point C in a direction opposite from the second bonding point Z.

In general, such an operation of the capillary 4 to be moved in the direction opposite from the second bonding point Z is referred to as a "reverse operation". As a result, the portion of the wire 3 between the points A and C is formed to be inclined and the wire 3 is formed at an upper end of the inclined portion thereof with a kink 3a by a lower end of the capillary 4. The portion of the wire 3 between the points A and C thus delivered corresponds to the height of a neck portion H (or a portion of the wire 3 between the pad 2a and the kink 3a) and will constitute the neck portion H shown in FIG. 5A.

Subsequently, in step (d) of FIG. 6, the capillary 4 is vertically raised to a point D while the wire 3 is delivered. Then, in step (e) of FIG. 6, the reverse operation of the capillary 4 is performed again, i.e. the capillary 4 is horizontally moved to a point E in the direction opposite from the second bonding point Z. As the result of this reverse operation, the wire 3 has another inclined portion extending between the points C and E, and a kink 3b is formed in an upper end of this inclined portion of the wire 3.

This inclined portion of the wire 3 thus delivered will constitute an upper base portion L (or a portion of the wire 3 between the kinks 3a and 3b) of the wire loop having a trapezoidal shape shown in FIG. 5A. Thereafter, in step (f) of FIG. 6, the capillary 4 is vertically raised to a point F so that the wire 3 is delivered by a length corresponding to a long inclined portion S (or a portion of the wire 3 between the kink 3b and the lead 1a) of the wire loop shown in FIG. 5A. Subsequently, the capillary 4 is lowered to the second bonding point Z via positions $f_1$ and $f_2$, so that the wire 3 is bonded to the second bonding point Z or the lead 1a.

The wire loop having a triangular shape shown in 5B is formed by a sequence of steps as shown in FIG. 7. Since the wire loop having a triangular shape is not provided with an upper base portion (L) unlike the wire loop having a trapezoidal shape described above, in forming the wire loop of a triangular shape, the second reverse operation in steps (d) and (e) of FIG. 6 is not conducted. Therefore, in this instance, a step that corresponds to the steps (d), (e) and (f except for $f_1$ and $f_2$) of FIG. 6 is carried out only in step (d) of FIG. 7. More particularly, steps (a), (b) and (c) of FIG. 7 are the same as the steps (a), (b) and (c) of FIG. 6, and after the first reverse operation in step (c) of FIG. 7, the capillary 4 is vertically raised to a point F in step (d) of FIG. 7 while the wire 3 is delivered. Subsequently, in step (e) of FIG. 7, the capillary 4 is moved via positions $e_1$ and $e_2$ in a manner similar to that in step (f) of FIG. 6, with the result that the wire 3 is bonded to the second bonding point Z or the lead 1a.

When a wire loop is formed by such a bonding method, a wire connection at the second bonding point Z or on the lead 1a has a crescent shape as the result of crushing with an end portion of the capillary, so that there is a possibility that the wire connection cannot maintain an adequate pull strength.

For this reason, a bonding method called security bonding has been proposed which performs ball bonding with respect to the top of the end-bonded wire. As described in Japanese Patent Application Laid-Open Publication No. 57-12530, this method comprises bonding a wire to a second bonding point, then cutting the wire and forming a ball at the tip of the wire and finally bonding the ball onto the second bonding point again from above. After the ball bonding, the wire is cut as is or end bonding is performed at a point which does not overlap the ball bonded position.

In the aforementioned security bonding method, however, after wire bonding with respect to the second bonding point, the wire is cut and then a ball is newly formed at the tip of the wire, followed by ball bonding with respect to the second bonding point, resulting in the method being time-consuming.

SUMMARY OF THE INVENTION

The present invention has been made in view of the foregoing disadvantages of the prior art.

Accordingly, it is an object of the present invention to provide a wire loop having a certain shape which is capable of enhancing a wire bonding strength at a second bonding point and reducing the time to perform wiring.

It is another object of the present invention to provide a semiconductor device having said wire loop incorporated therein.

It is still another object of the present invention to provide a wire bonding method capable of forming said wire loop.

In accordance with a first aspect of the present invention, a wire loop is provided. The wire loop comprises: a wire connecting a first bonding point and a second bonding point therethrough, wherein an additional wire loop is formed at an extended portion of the wire wire-bonded to the second bonding point without cutting the wire, the additional wire loop being bonded to the second bonding point or to the vicinity thereof while part of the wire is crushed.

In a preferred embodiment of the present invention, a plurality of the additional wire loops may be formed and bonded to the second bonding point or to the vicinity thereof.

In accordance with a second aspect of the present invention, a method of wire bonding between a first bonding point and a second bonding point is provided. The method comprises the steps of:

(a) bonding a wire to the first bonding point;

(b) then forming a wire loop extending from the first bonding point to the second bonding point by performing loop control involving a vertical or horizontal movement of a capillary or a motion of the capillary combining both wherein the capillary passes through at least one point which has been set;

(c) thereafter bonding the wire to the second bonding point;

(d) then forming an additional wire loop by delivering the wire while performing loop control involving a vertical or horizontal movement of the capillary or a motion of the capillary combining both wherein the capillary passes through at least another point which has been set; and (e) subsequently bonding the additional wire loop to the second bonding point or to the vicinity thereof while part of the wire is crushed.

In the above steps, the term "at least one point which has been set" means "n" points ("n" indicating a natural number) that are each set on the coordinate axes (X, Y, Z) in advance as a passing point of the capillary during its movement.

In the bonding method of the present invention, the steps (d) and (e) may be alternately repeated a plurality of times, so that a plurality of the additional wire loops are formed and bonded to the second bonding point or to the vicinity thereof.

In accordance with a third aspect of the present invention, a semiconductor device is provided. The semiconductor device comprises: a first bonding point; a second bonding point; and a wire loop including a wire connecting the first bonding point and the second bonding point therethrough, wherein the wire loop includes an additional wire loop that is formed at an extended portion of the wire wire-bonded to the second bonding point without cutting the wire, the additional wire loop being bonded to the second bonding point or to the vicinity thereof while part of the wire is crushed.

In a preferred embodiment of the present invention, the wire loop of the semiconductor device may be arranged in such a manner that a plurality of the additional wire loops are formed and bonded to the second bonding point or to the vicinity thereof.

It is thus possible according to the present invention to provide a wire loop having a certain shape which enhances a wire bonding strength at the second bonding point and which is capable of reducing the time to perform wiring, a semiconductor device provided with such a wire loop and a wire bonding method.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE INVENTION

Figure 1A:
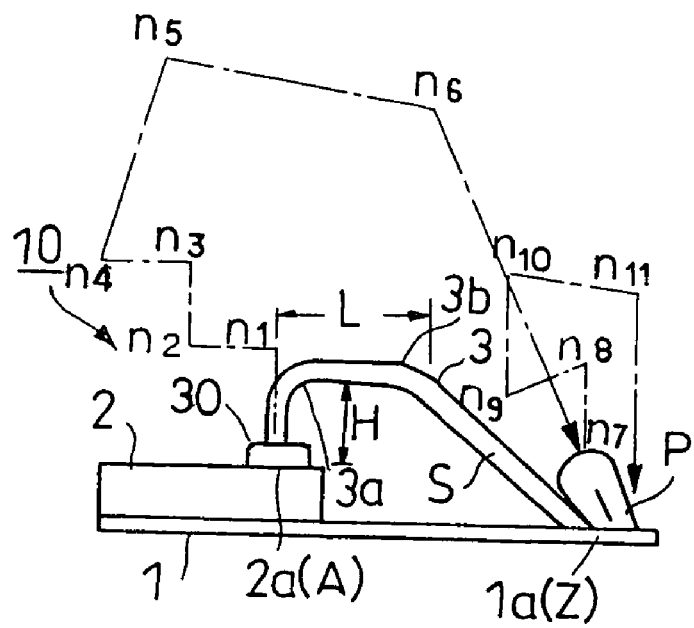
FIG. 1A is an elevational view showing an embodiment of a semiconductor device according to the present invention and a shape of a wire loop thereof.

Now, a wire loop, a semiconductor device and a wire bonding method according to the present invention will be described hereinafter with reference to the accompanying drawings in which like parts in each of the several figures are identified by the same reference character or numeral.

Referring first to FIG. 1A, an embodiment of a wire loop and a semiconductor device 10 having the wire loop incorporated therein according to the present invention is illustrated. In the semiconductor device 10, a semiconductor chip 2 is attached to a lead frame 1 and is provided thereon with a pad 2a which is a first bonding point A. The wire loop of a wire 3 is formed to have a trapezoidal shape in general and includes a neck portion H having a ball 30 bonded to the pad 2a or first bonding point A and a major portion consisting of a horizontal upper portion L and an inclined portion S which has an end bonded to a lead 1a of the lead frame 1 or a second bonding point Z. The horizontal upper portion L of the wire loop is provided at the opposite ends thereof with kinks 3a and 3b.

The above configuration of the illustrated embodiment is approximately the same as that of a conventional semiconductor device. However, the illustrated embodiment has a major feature in an area in the vicinity of the second bonding point Z.

More specifically, after wire bonding at the second bonding point, an additional wire loop is formed without cutting the wire, and bonding is carried out at the second bonding point or in the vicinity thereof while part of the wire is crushed. This allows the semiconductor device 10 to have a wire loop provided with an enlarged bonding area at the second bonding point.

A description will be given next of an embodiment of a wire bonding method according to the present invention for obtaining the semiconductor device 10 shown in FIG. 1A and a shape of the wire loop formed by the method with reference to FIG. 2.

Figure 2:
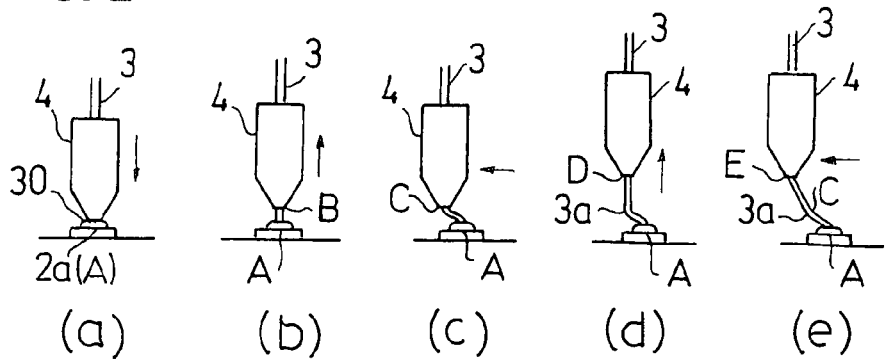
FIG. 2 is a schematic diagram showing the steps for forming a wire loop having a shape shown in FIG. 1A.
Figure 2:
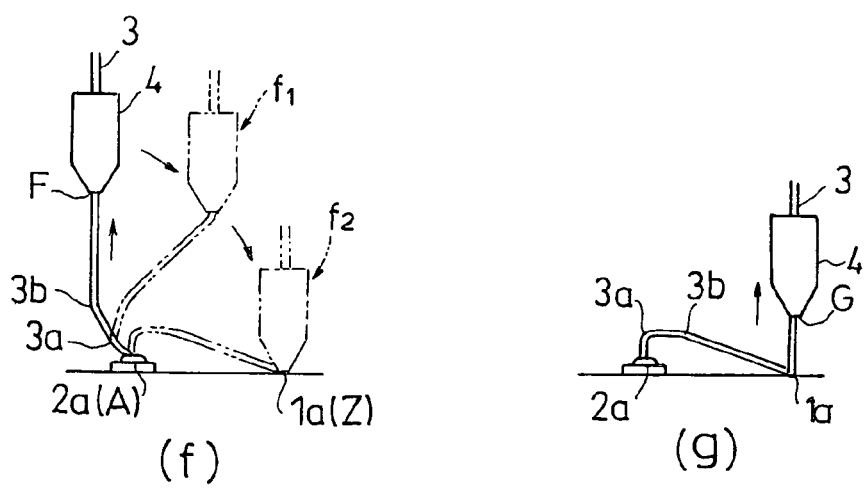
Figure 2:
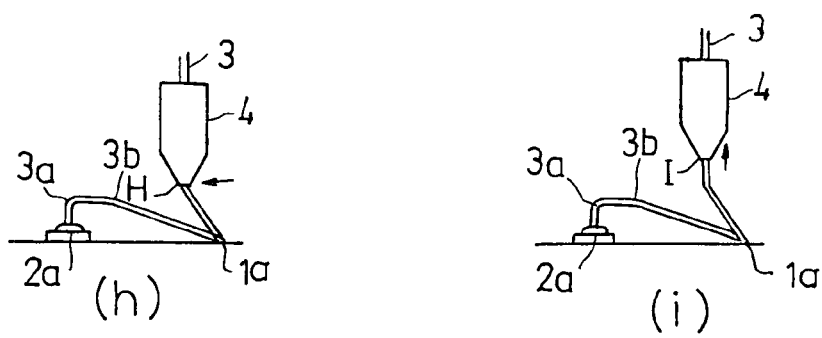
Figure 2:
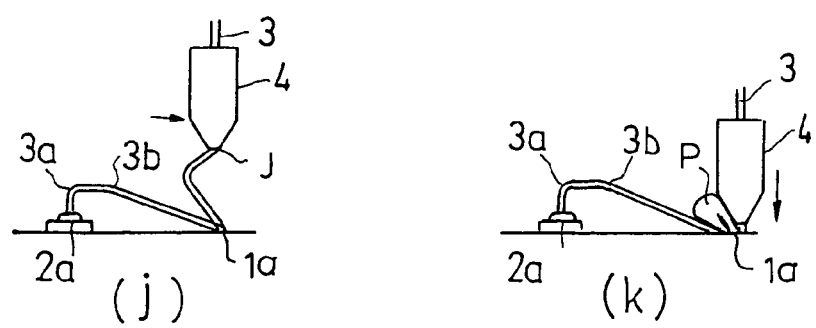

In step (a) of FIG. 2, the capillary 4 is lowered, so that a ball 30 formed on the tip of the wire 3 is bonded to the first bonding point A. Then, in step (b) of FIG. 2, the capillary 4 is vertically raised to a point B while the wire 3 is delivered.

Thereafter, in step (c) of FIG. 2, a reverse operation of the capillary 4 is carried out, i.e. the capillary 4 is horizontally moved in a direction opposite from the second bonding point z to a point C. As a result, a portion of the wire 3 is slanted from the points A to C, and a kink 3a is formed at an upper end of the slanted portion of the wire 3.

The portion of the wire 3 from the points A to C constitutes the neck portion H (between the pad 2a and the kink 3a) shown in FIG. 1A.

Thereafter, in step (d) of FIG. 2, the capillary 4 is vertically raised to a point D while the wire 3 is delivered. Subsequently, in step (e) of FIG. 2, the capillary 4 is moved horizontally again to a point E in the direction opposite from the second bonding point Z, i.e., another reverse operation is carried out. This renders the wire 3 slanted from the points C to E and having another kink 3b formed at an upper end of this slanted portion of the wire 3.

The portion of the wire 3 from the points C to E constitutes the upper portion L (between the kinks 3*a* and 3*b*) of the trapezoid shown in FIG. 1A. Thereafter, in step (f) of FIG. 2, the capillary 4 is vertically raised to a point F so that the wire 3 is delivered by a length which corresponds to the inclined portion S of the wire 3 extending between the kink 3*b* and the lead 1*a*. Then, in step (f) of FIG. 2, the capillary 4 is lowered via positions $f_1$ and $f_2$ to be located at the second bonding point Z, whereby the wire 3 is bonded to the second bonding point Z.

Though in a conventional wire loop of a trapezoidal shape, the wire 3 is cut here, the capillary 4 is vertically raised to a point G in step (g) of FIG. 2 in the embodiment of the present invention while the wire 3 is delivered. Next, in step (h) of FIG. 2, the capillary 4 is horizontally moved to a point H in the direction toward the first bonding point A so as to move away from the second bonding point Z. This renders the wire 3 slanted from the lead 1*a* to the point H. Thereafter, in step (i) of FIG. 2, the capillary 4 is vertically raised to a point I while the wire 3 is delivered. Then, in step (j) of FIG. 2, the capillary 4 is horizontally moved to a point J in the direction toward the second bonding point Z. Next, in step (k) of FIG. 2, the capillary 4 is lowered, so that the wire 3 is wire bonded onto the second bonding point Z or to the vicinity thereof.

It is to be noted that steps (g) to (k) of FIG. 2 correspond to the steps (d) and (e) claimed in the claims of the present invention. Performing these steps forms an additional wire loop P and crushes part of the wire 3, to thereby enlarge the bonding area at the second bonding point Z, resulting in a bonding strength at the second bonding point being enhanced. It is to be noted that steps (g) to (k) of FIG. 2, i.e. the claimed steps (d) and (e) may be repeated a plurality of times wherein the second bonding point has two thicknesses of wire crushed together at a distal end of the wire for extending the bonding area of the second bonding point as shown in FIG. 2(*k*).

In carrying out the above steps, loop control is performed by setting, in advance, a plurality of passing points n1, n2, n3, . . . of the capillary 4 during its movement on the coordinate axes (X, Y, Z) as shown in FIG. 1A.

The method of the present invention, while enabling a bonding strength of the same level, ensures a reduction of the time to form a wire loop, as compared with security bonding—a conventionally proposed method—that comprises bonding a wire to the second bonding point, then cutting the wire and newly forming a ball at the tip of the wire, and finally ball bonding to the second bonding point again from above.

Figure 1B:
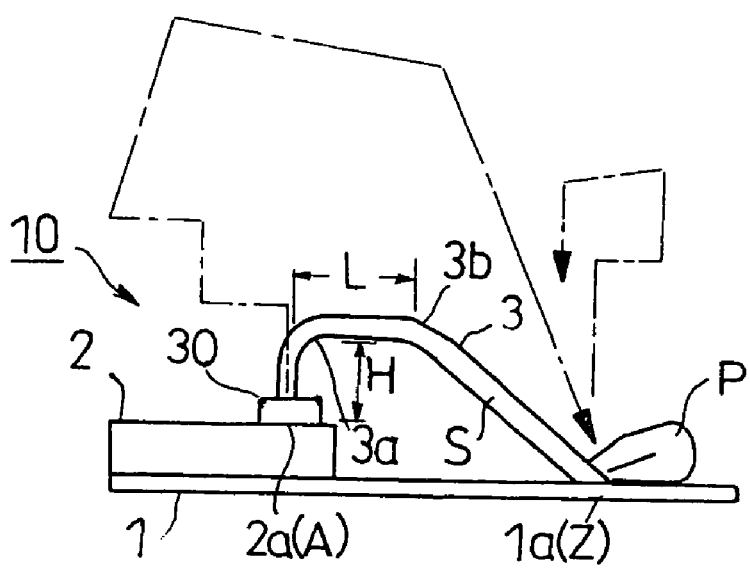
FIG. 1B is an elevational view showing another embodiment of a semiconductor device according to the present invention.

Now, a description will be given of another embodiment of the wire bonding method according to the present invention for obtaining a semiconductor device 10 as shown in FIG. 1B and a shape of the wire loop formed by the method with reference to FIG. 3.

Figure 3:
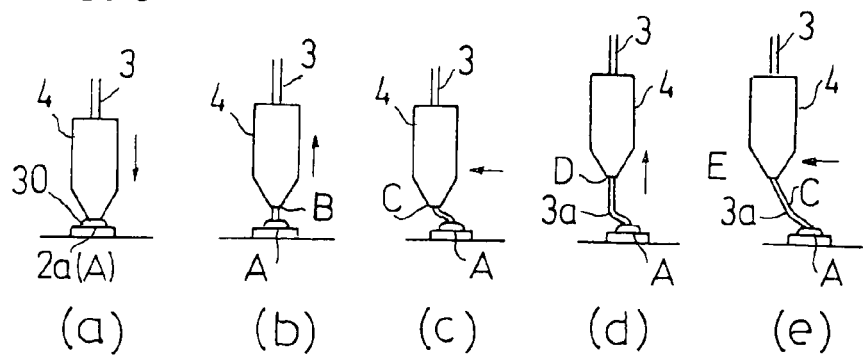
FIG. 3 is a schematic diagram showing the steps for forming a wire loop having a shape shown in FIG. 1B.
Figure 3:
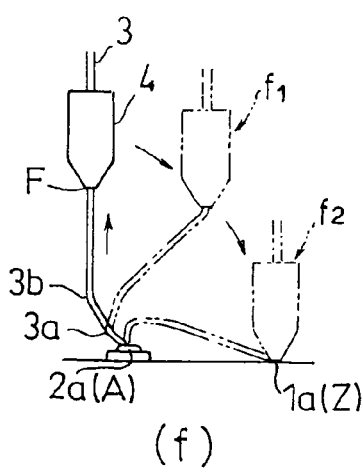
Figure 3:
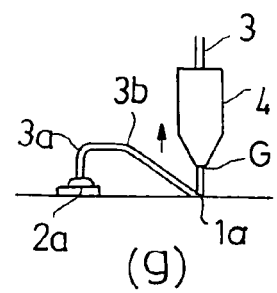
Figure 3:
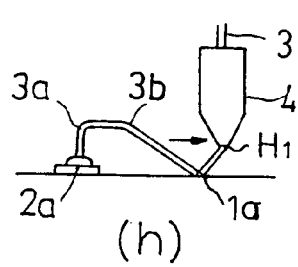
Figure 3:
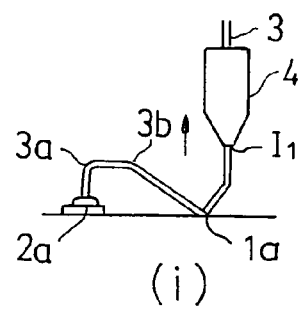
Figure 3:
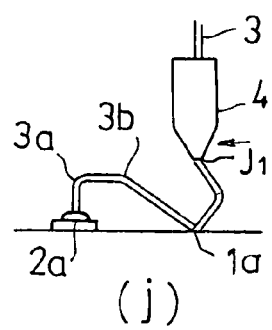
Figure 3:
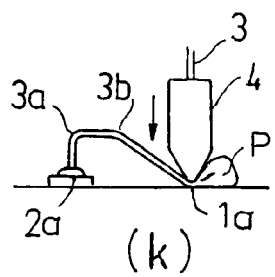

Steps (a) to (f) in FIG. 3 are the same as steps (a) to (f) in FIG. 2, and so their description will be omitted. Differences lie in steps (g) to (k) shown in FIG. 3. More specifically, in step (f) as shown in FIG. 3, the capillary 4 is lowered via positions $f_1$ and $f_2$ to be located at the second bonding point Z and the wire 3 is bonded to the second bonding point Z. Thereafter, in step (g) of FIG. 3, the capillary 4 is vertically raised to a point G while the wire 3 is delivered, and in step (h) of FIG. 3, the capillary 4 is horizontally moved to a point $H_1$ in the direction away from the first bonding point A. This renders the wire 3 slanted. Then, in step (i) of FIG. 3, the capillary 4 is vertically raised to a point $I_1$ while the wire 3 is delivered. Then, in step (j) of FIG. 3, the capillary 4 is horizontally moved to a point $J_1$ in the direction toward the first bonding point A (or second bonding point Z). Next, in step (k) of FIG. 3, the capillary 4 is lowered, so that the wire 3 is wire bonded to the second bonding point Z or to the vicinity thereof.

It is to be noted that steps (g) to (k) of FIG. 3 correspond to the claimed steps (d) and (e) in the present invention. Performing these steps crushes the wire 3 as with steps (g) to (k) of FIG. 2, to thereby enlarge the bonding area at the second bonding point Z, resulting in a bonding strength at the second bonding point being enhanced. It is to be noted that steps (g) to (k) of FIG. 3, i.e. the claimed steps (d) and (e) of the present invention may be repeated a plurality of times.

Figure 4A:
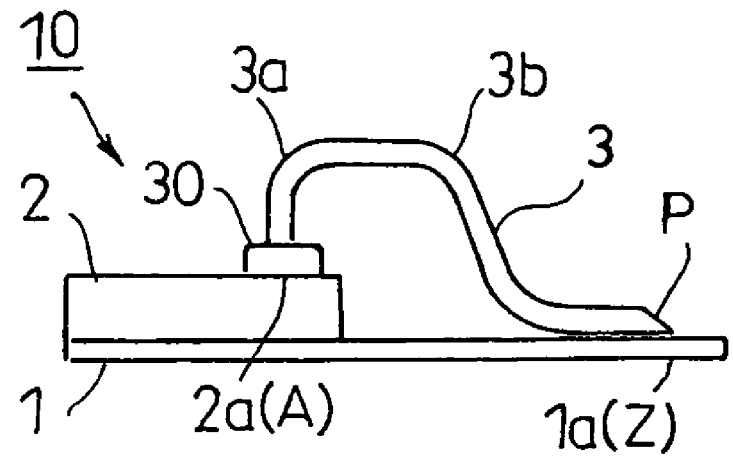
FIGS. 4A and 4B are elevational views each showing an example of a wire loop having a shape like an approach and landing of an aircraft.

With these steps, it is possible to obtain a wire loop having a shape like an approach and landing of an aircraft as shown in FIG. 4A with part of the wire 3 parallely touching the second bonding point Z by adjusting an amount of the movement of the capillary, thus enhancing a bonding strength.

Figure 4B:
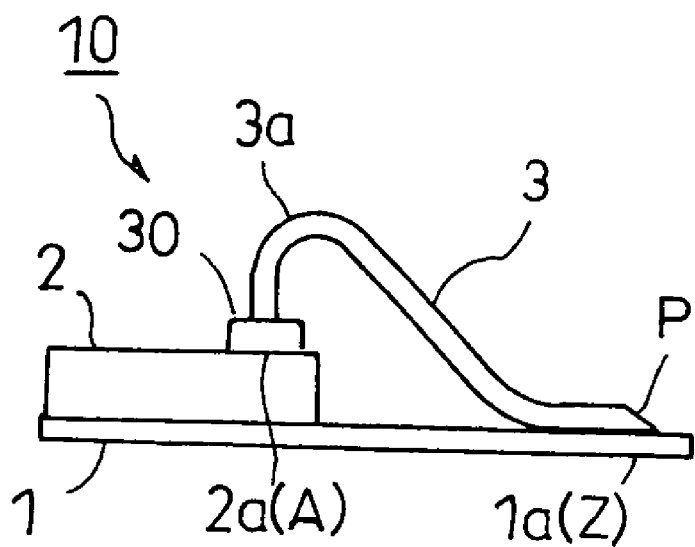
Figure 5A:
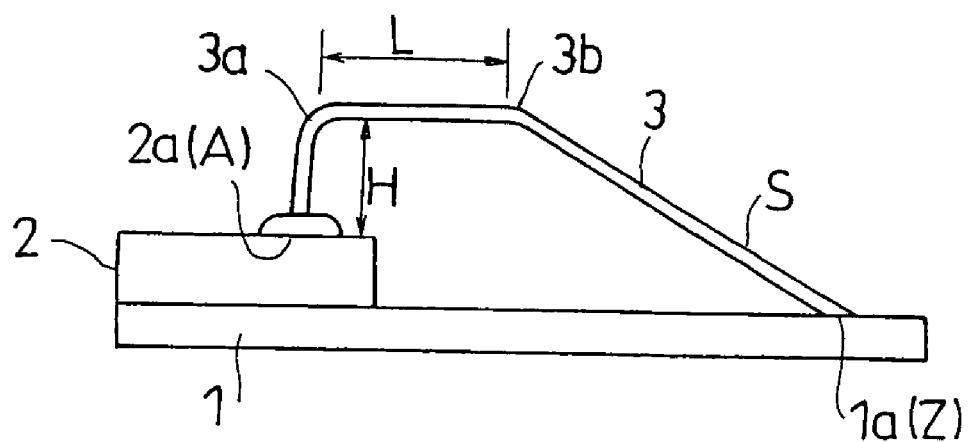
FIGS. 5A and 5B are elevational views showing conventional wire loops having a trapezoidal shape and a triangular shape, respectively.
Figure 5B:
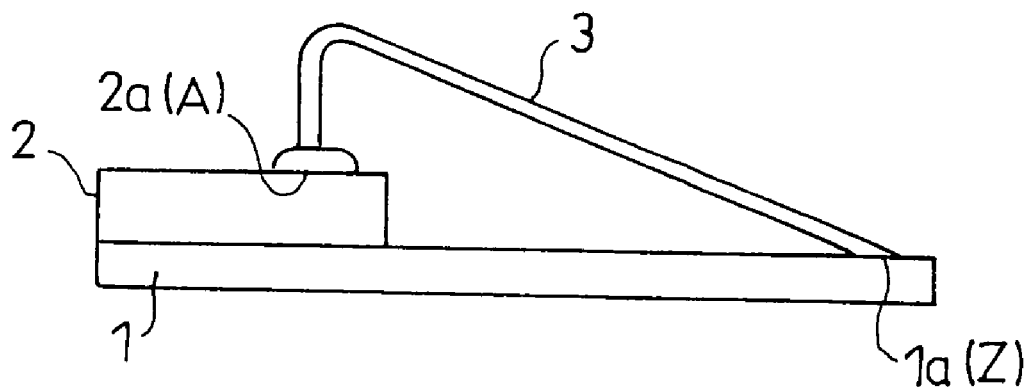
Figure 6:
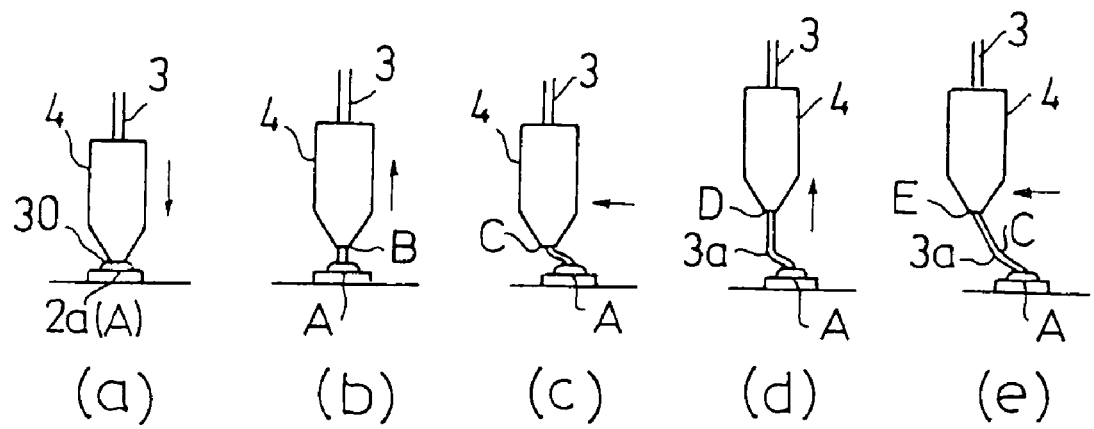
FIG. 6 is a schematic diagram showing wire shapes in respective steps in association with the movement of the capillary to form the wire loop of a trapezoidal shape shown in FIG. 5A.
Figure 6:
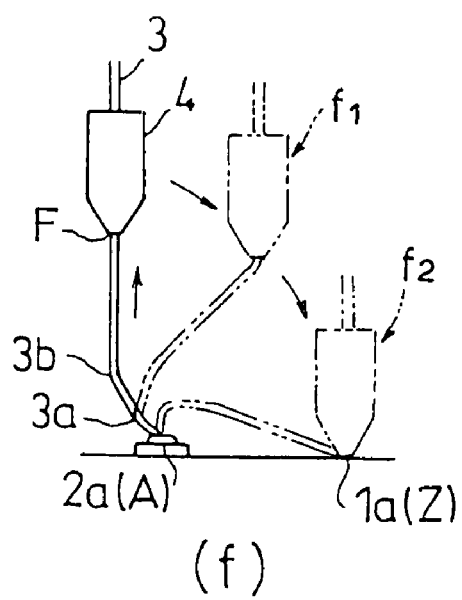
Figure 7:
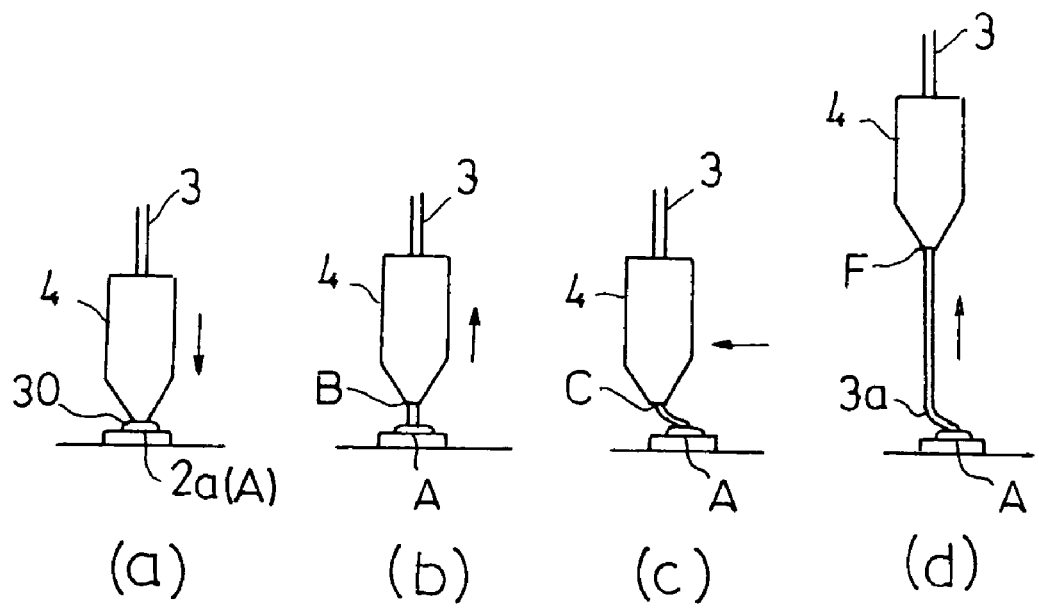
FIG. 7 is a schematic diagram showing wire shapes in respective steps in association with the movement of the capillary to form the wire loop of a triangular shape shown in FIG. 5B.
Figure 7:
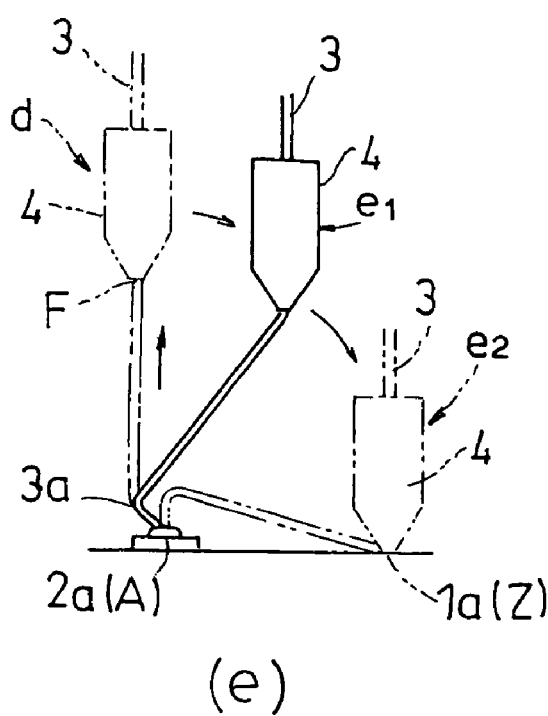

Even in the case of a wire loop having a triangular shape as shown in FIG. 5B, it is possible to obtain a wire loop having a shape like an approach and landing of an aircraft as shown in FIG. 4B in a similar manner.

It is to be noted that while in steps (g) to (k) of FIG. 2 or in steps (g) to (k) of FIG. 3, the capillary 4 is moved either in the direction toward the first bonding point A or in the direction opposite therefrom relative to the second bonding point Z, but the direction is not limited thereto and any direction can be selected in the 360° range with respect to the second bonding point as desired, thus making it possible to obtain a wire loop having a form different in orientation of the crushed wire. In addition, a bonding strength of the wire loop thus obtained is similarly high.

The present invention is applicable to manufacturing of a semiconductor device as a wire bonding method that provides a high wire bonding strength to bonding points and reduces the time to perform wiring.

While the illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A method of wire bonding between a first bonding point and a second bonding point to electrically connect a pad on a semiconductor chip to a lead frame to provide a final wiring configuration of a low profile wire connection with one or more unbonded folded loops extending upward from the second bonding point, comprising the steps of:

(a) bonding a wire to the first bonding point, wherein the first bonding point is located on the pad of the semiconductor chip;

(b) then forming a first wire loop extending from the first bonding point to the second bonding point by performing loop control involving a vertical or horizontal movement of a capillary or a motion of the capillary combining both wherein the capillary passes through at least one point which has been set;

(c) thereafter bonding the wire to the second bonding point, wherein the second bonding point is located on a lead of the lead frame;

(d) then forming an additional second wire loop smaller than the first wire loop by delivering the wire while performing loop control involving a vertical and horizontal movement of the capillary wherein the capillary passes through at least another point which has been set and includes, vertically raising the capillary to a first point while delivering the wire, then horizontally moving the capillary in the direction toward the first bonding point to a second point, thereafter vertically raising the capillary to a third point while delivering the wire, and subsequently horizontally moving the capillary to a fourth point across the second bonding point;

folding the wire between the third point and the fourth point to form a second loop and crushing a portion of the wire extending from the second wire loop on one side of the second bonding point;

wherein the second wire loop is formed to have a folded portion located on a side of the second bonding point nearer to the first bonding point; and (e) subsequently performing a third bonding of the crushed end of the wire extending from the second wire loop in the vicinity of the second bonding point so that the second wire loop is formed to have a folded unbonded portion extending between the second bonding point and the third bonding point with a vertex of the second wire loop offset from the third bonding point, whereby the total bonding area adjacent the second bonding point is enlarged.

2. The bonding method as defined in claim 1, wherein the steps (d) and (e) are alternately repeated a plurality of times, so that a plurality of additional wire loops are formed and bonded to enlarge the area of the second bonding point.

3. The bonding method as defined in claim 1, wherein the additional wire loop is formed at a distal end of the wire extending beyond the second bonding point.

4. The bonding method as defined in claim 1, wherein the second bonding point has a plurality of additional loops of wire crushed together to enlarge the second bonding area.

5. The bonding method as defined in claim 1, wherein the second bonding point has two thicknesses of wire crushed together at a distal end of the wire for extending the bonding area of the second bonding point.

6. A method of wire bonding between a first bonding point (A) which is located on a pad provided on a semiconductor chip attached to a lead frame and a second bonding point (Z) located on a lead provided on the lead frame, comprising the steps of:

(a) bonding a ball formed on a tip of a wire to the first bonding point;

(b) forming a first wire loop extending from the first bonding point to the second bonding point by performing loop control involving a vertical or horizontal movement of a capillary or a motion of the capillary combining both wherein the capillary passes through at least one point (B, C, D, E, F) which has been set;

(c) bonding the wire to the second bonding point;

(d) forming a second wire loop by delivering the wire while performing loop control involving a vertical and horizontal movement of the capillary or a motion of the capillary combining both wherein the capillary passes through at least another point which has been set and includes, vertically raising the capillary to a point (G) while delivering the wire, horizontally moving the capillary in the direction away from the first bonding point to another point (H), vertically raising the capillary to yet another point (I) while delivering the wire, and horizontally moving the capillary to a further point (J) above the second bonding point, wherein the second wire loop is formed to have a folded portion located on a side of the second bonding point furthest from the first bonding point; and (e) bonding an end of the wire extending from the second wire loop in the vicinity of the second bonding point while part of the wire is crushed so that the second wire loop is formed to have an unbonded folded portion with a vertex of the unbonded folded portion offset and extending from the second bonding point away from the first bonding point, whereby the bonding area at the second bonding area is enlarged.

7. The bonding method as defined in claim 6, wherein the steps (d) and (e) are alternately repeated a plurality of times, so that a plurality of the additional wire loops are formed and bonded to enlarge the area of the second bonding point.

8. A method of wire bonding between a first bonding point (A) which is located on a pad provided on a semiconductor chip attached to a lead frame and a second bonding point (Z) located on a lead provided on the lead frame, with a low vertical profile consisting of the steps of:

(a) bonding a ball formed on a tip of a wire to the first bonding point;

(b) forming a first wire loop extending from the first bonding point to the second bonding point by performing loop control involving a vertical or horizontal movement of a capillary or a motion of the capillary combining both wherein the capillary passes through at least one point (B, C, D, E, F) which has been set;

(c) bonding the wire directly to the second bonding point;

(d) vertically delivering a continuation of the wire from the second bonding point;

(e) forming a second wire loop by delivering the wire while performing loop control involving a vertical and horizontal movement of the capillary or a motion of the capillary combining both wherein the capillary passes through at least another point which has been set and includes, vertically raising the capillary to a point (G) while delivering the wire, horizontally moving the capillary in the direction away from the first bonding point to another point (H), vertically raising the capillary to yet another point (I) while delivering the wire, and horizontally moving the capillary to a further point (J) above the second bonding point, wherein the second wire loop is formed to have a folded unbonded portion located on a side of the second bonding point furthest from the first bonding point; and (f) bonding an end of the wire extending from the second wire loop in the vicinity of the second bonding point, without formation of a ball, while part of the wire is crushed so that the second wire loop is formed to have a slanted unbonded folded portion extending vertically upward from the second bonding point and away from the first bonding point, whereby the bonding area at the second bonding area is enlarged.

9. The bonding method as defined in claim 8, wherein the steps (d) and (e) are alternately repeated a plurality of times, so that a plurality of the additional wire loops are formed and bonded to enlarge the area of the second bonding point.

* * * * *